(12) United States Patent
Chen et al.

(10) Patent No.: US 12,211,960 B2
(45) Date of Patent: Jan. 28, 2025

(54) MICRO LIGHT-EMITTING DIODE DISPLAY DEVICE AND MANUFACTURING METHOD THEREOF

(71) Applicant: PlayNitride Display Co., Ltd., Miaoli County (TW)

(72) Inventors: Yen-Yeh Chen, Miaoli County (TW); Yu-Jui Tseng, Miaoli County (TW); Sheng-Yuan Sun, Miaoli County (TW); Loganathan Murugan, Miaoli County (TW); Po-Wei Chiu, Miaoli County (TW)

(73) Assignee: PLAYNITRIDE DISPLAY CO., LTD., Miaoli County (TW)

( * ) Notice: Subject to any disclaimer, the term of this patent is extended or adjusted under 35 U.S.C. 154(b) by 231 days.

(21) Appl. No.: 17/517,824

(22) Filed: Nov. 3, 2021

(65) Prior Publication Data
US 2023/0033031 A1 Feb. 2, 2023

(30) Foreign Application Priority Data
Jul. 29, 2021 (TW) .................................. 110127968

(51) Int. Cl.
*H01L 33/50* (2010.01)
*H01L 27/15* (2006.01)
(Continued)

(52) U.S. Cl.
CPC .......... *H01L 33/502* (2013.01); *H01L 27/156* (2013.01); *H01L 33/005* (2013.01); *H01L 33/10* (2013.01)

(58) Field of Classification Search
CPC ..... H01L 27/156; H01L 33/005; H01L 33/10; H01L 33/20; H01L 33/502; H01L 33/504; H01L 33/507; H01L 33/58; H01L 33/62
See application file for complete search history.

(56) References Cited

U.S. PATENT DOCUMENTS

2017/0287887 A1* 10/2017 Takeya ................ H01L 25/0753
2018/0308420 A1* 10/2018 Shin ......................... G09G 3/14
(Continued)

FOREIGN PATENT DOCUMENTS

CN 106935716 A 7/2017
CN 110634905 A 12/2019
(Continued)

*Primary Examiner* — Matthew C Landau
*Assistant Examiner* — Dmitriy Yemelyanov
(74) *Attorney, Agent, or Firm* — MUNCY, GEISSLER, OLDS & LOWE, P.C.

(57) ABSTRACT

A micro LED display device includes an epitaxial structure layer, a connection layer, a light conversion layer and a transparent layer. The epitaxial structure layer includes a plurality of micro LEDs disposed apart from each other. The connection layer is disposed at one side of the epitaxial structure layer away from the micro LEDs. The light conversion layer is fixed on the epitaxial structure layer through the connection layer and includes a plurality of light conversion portions. Each of the light conversion portions corresponds to one of the micro LEDs. The transparent layer is disposed at one side of the light conversion layer away from the epitaxial structure layer. The ratio of the thickness of the transparent layer to the width of each light conversion portion is between 0.1 and 40. A manufacturing method of the micro LED display device is also provided.

12 Claims, 11 Drawing Sheets

(51) Int. Cl.
*H01L 33/00* (2010.01)
*H01L 33/10* (2010.01)

(56) References Cited

U.S. PATENT DOCUMENTS

| | | | |
|---|---|---|---|
| 2019/0189864 A1* | 6/2019 | Ye | H01L 33/504 |
| 2019/0267357 A1* | 8/2019 | Iguchi | H01L 25/0753 |
| 2020/0028036 A1* | 1/2020 | Bonar | H01L 33/507 |
| 2021/0074770 A1* | 3/2021 | Choe | G02B 5/0242 |
| 2021/0111164 A1 | 4/2021 | Chen et al. | |

FOREIGN PATENT DOCUMENTS

| | | | | |
|---|---|---|---|---|
| CN | 111725251 A | * | 9/2020 | H01L 27/156 |
| CN | 212625583 U | | 2/2021 | |
| CN | 113299679 A | | 8/2021 | |
| JP | 2016218151 A | | 12/2016 | |
| JP | 2018132662 A | | 8/2018 | |
| TW | 201928931 A | | 7/2019 | |
| TW | I-725691 B | | 4/2021 | |
| WO | WO-2015174464 A1 | * | 11/2015 | G02B 5/20 |

* cited by examiner

MICRO LIGHT-EMITTING DIODE DISPLAY DEVICE AND MANUFACTURING METHOD THEREOF

CROSS REFERENCE TO RELATED APPLICATIONS

This Non-provisional application claims priority under 35 U.S.C. § 119(a) on Patent Application No(s). 110127968 filed in Taiwan, Republic of China on Jul. 29, 2021, the entire contents of which are hereby incorporated by reference.

BACKGROUND

Technology Field

The present disclosure relates to a display device and, in particular, to a micro light-emitting diode (LED) display device and a manufacturing method thereof.

Description of Related Art

Micro light-emitting diode (LED) is currently one of the potential display technologies. In particular, the micro LED display device has many advantages such as low power consumption, high resolution, high contrast, high brightness, wide color gamut, fast response time, small size, light weight, and long lifespan. Therefore, it has the opportunity to become the next generation of display devices.

In the conventional micro LED display device, especially for the display device that uses the quantum dots technology to perform light color conversion, it has critical requirements for resistance to moisture and oxygen. Thus, a protection substrate (e.g., a glass or sapphire substrate) is usually attached to the finished panel during the manufacturing process so as to protect the internal components of the panel from foreign objects or moisture. However, the micro LED display device manufactured in this way has a very thick protection substrate (usually 100 µm or thicker). This feature not only massively increases the thickness and weight of the display device, but may cause the crosstalk or wave guiding problem that seriously affects the display quality.

SUMMARY

One or more exemplary embodiments of this disclosure are to provide a micro LED display device and manufacturing method thereof that can prevent the crosstalk or wave guiding problem so as to improve the display quality and decrease the thickness and weight of the display device.

In an exemplary embodiment, a micro LED display device of this disclosure includes an epitaxial structure layer, a connection layer, a light conversion layer, and a transparent layer. The epitaxial structure layer includes a plurality of micro LEDs disposed apart from each other. The connection layer is disposed at one side of the epitaxial structure layer away from the micro LEDs. The light conversion layer is fixed on the epitaxial structure layer through the connection layer and comprises a plurality of light conversion portions. Each of the light conversion portions corresponds to one of the micro LEDs and has a width. The transparent layer is disposed at one side of the light conversion layer away from the epitaxial structure layer and has a thickness. The ratio of the thickness of the transparent layer to the width of each light conversion portion is between 0.1 and 40.

In one embodiment, the thickness of the transparent layer is less than or equal to 20 µm.

In one embodiment, each micro LEDs has a chip width, and the chip width is less than or equal to 3 µm.

In one embodiment, the micro LED display device further includes a light filter layer disposed between the light conversion layer and the transparent layer. The light filter layer includes a plurality of light filter portions, and each of the light filter portions correspond to each of the light conversion portions, respectively.

In one embodiment, the micro LED display device further includes a protection layer disposed between the light conversion layer and the transparent layer.

In one embodiment, the micro LED display device further includes a light-shielding structure patterned on the epitaxial structure layer. The light-shielding structure includes a plurality of light-shielding portions, and the light-shielding portions define a plurality of light conversion regions. The light conversion regions are separately located inside the light conversion layer, and each of the light conversion regions corresponds to one of the micro LEDs.

In one embodiment, each of the light-shielding portions includes a first section and a second section, the second section is located between the transparent layer and the first section, and a projection area of the first section projected on the epitaxial structure layer is smaller than a projection area of the second section projected on the epitaxial structure layer.

In one embodiment, a cross-sectional area of the first section is tapered off in a direction from the second section to the epitaxial structure layer.

In one embodiment, each light-shielding portion includes a first section and a second section, the second section is located between the transparent layer and the first section, the first section has one end away from the second section, the end and the connection layer define a first contact area, the first section and the second section define a second contact area, and the second contact area is greater than the first contact area.

In one embodiment, each light-shielding portion further includes a light reflection region.

In one embodiment, each of the light reflection regions is located in the first section of each of the light-shielding portions, and the light reflection regions are disposed corresponding to the light conversion regions.

In one embodiment, a part of the connection layer is located between the light conversion layer and the epitaxial structure layer, and the refractive index of the epitaxial structure layer is less than the refractive index of the connection layer.

In one embodiment, the epitaxial structure layer further includes a plurality of protrusion portions protruding toward the light conversion layer, and each of the protrusion portions is disposed corresponding to one of the micro LEDs.

In one embodiment, the refractive index of the epitaxial structure layer is greater than the refractive index of the connection layer.

In one embodiment, at least one side of the transparent layer is configured with a plurality of refractive structures, the refractive structures protrude toward or away from the light conversion layer, and each of the refractive structures is disposed corresponding to one of the micro LEDs.

In one embodiment, the micro LED display device further includes a light refraction layer disposed at one side of the transparent layer away from the light conversion layer, and a surface of the light refraction layer is a rough surface.

In one embodiment, the density of the transparent layer is less than or equal to 2 g/cm$^3$.

In an exemplary embodiment, a manufacturing method of a micro LED display device includes: providing an epitaxial structure layer, wherein the epitaxial structure layer includes a plurality of micro LEDs disposed apart from each other; forming a connection layer at one side of the epitaxial structure layer away from the micro LEDs; providing a carrier and forming a release layer, a transparent layer and a light conversion layer on the carrier in order, wherein the transparent layer has a thickness, the light conversion layer comprises a plurality of light conversion portions, each of the light conversion portions corresponds to one of the micro LEDs and has a width, and a ratio of the thickness of the transparent layer to the width of each of the light conversion portions is between 0.1 and 40; attaching the light conversion layer to the connection layer, so that the carrier configured with the release layer, the transparent layer and the light conversion layer is fixed on the epitaxial structure layer through the connection layer; and removing the release layer and the carrier.

In one embodiment, the manufacturing method further includes: patterning a light-shielding structure on the carrier, wherein the light-shielding structure includes a plurality of light-shielding portions, the light-shielding portions define a plurality of separated light conversion regions, the light conversion regions are located inside the light conversion layer, and each of the light conversion regions corresponds to one of the micro LEDs; and forming a light filter layer between the light conversion layer and the transparent layer, wherein the light filter layer includes a plurality of light filter portions, and the light filter portions correspond to the light conversion portions, respectively.

In one embodiment, the manufacturing method further includes: forming a protection layer between the light conversion layer and the transparent layer.

As mentioned above, the release layer is provided on the carrier, so that the thick protection substrate (the carrier) used in the conventional micro LED display device can be removed, thereby sufficiently decreasing the thickness of the device. Accordingly, the crosstalk or wave guiding problem can be prevent so as to improve the display quality, and the thickness and weight of the micro LED display device can be decreased.

BRIEF DESCRIPTION OF THE DRAWINGS

The disclosure will become more fully understood from the detailed description and accompanying drawings, which are given for illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements. It should be noted that the drawings are illustrations of concepts, principles, and features, and may not be drawn to actual scales.

FIGS. 1A to 1F are schematic diagrams showing the manufacturing procedure of a micro LED display device according to an embodiment of this disclosure. As shown in FIGS. 1A to 1F, a manufacturing method of the micro LED display device according to the embodiment of this disclosure includes the following five steps.

Figure 1A:
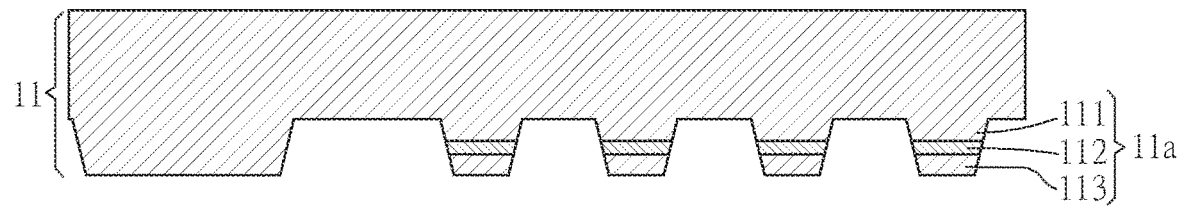
FIGS. 1A to 1F are schematic diagrams showing the manufacturing procedure of a micro LED display device according to an embodiment of this disclosure.

As shown in FIG. 1A, the first step is to provide an epitaxial structure layer 11, wherein the epitaxial structure layer 11 includes a plurality of micro LEDs 11a disposed apart from each other. In this embodiment, each micro LED 11a can be a light source for one subpixel, and include a first type semiconductor layer 111, a light-emitting layer 112, and a second type semiconductor layer 113, which are stacked in order. The light-emitting layer 112 is sandwiched between the first type semiconductor layer 111 and the second type semiconductor layer 113. In this embodiment, the first type semiconductor layer 111 is, for example, an N-type semiconductor, the second type semiconductor layer 113 is, for example, a P-type semiconductor, and the light-emitting layer 112 is, for example, an MQW (multiple quantum well) layer, but this disclosure is not limited thereto. Herein, one ends of the micro LEDs 11a are a common N-type semiconductor layer, which forms a common N-type structure, but this disclosure is not limited thereto. In different embodiments, the first type semiconductor layer 111 can be a P-type semiconductor, and the second type semiconductor layer 113 can be an N-type semiconductor. In this case, one ends of the micro LEDs 11a form a common P-type structure.

Figure 1B:
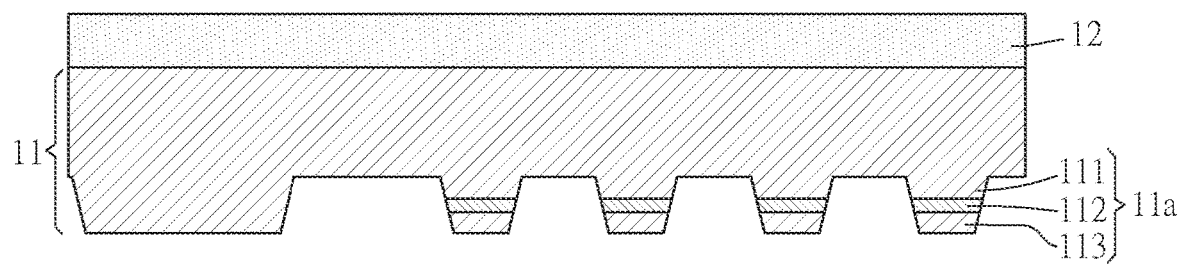

Next, as shown in FIG. 1B, the second step is to form a connection layer 12 at one side of the epitaxial structure layer 11 away from the micro LEDs 11a. In this embodiment, the connection layer 12 is a light-permeable insulation film configured to connect (adhere) to the subsequent component(s). The material of the connection layer 12 can be, for example, an optical clear adhesive (OCA) or an optical clear resin (OCR). In this embodiment, the material of the connection layer 12 is an optical clear adhesive (OCA).

Figure 1C:
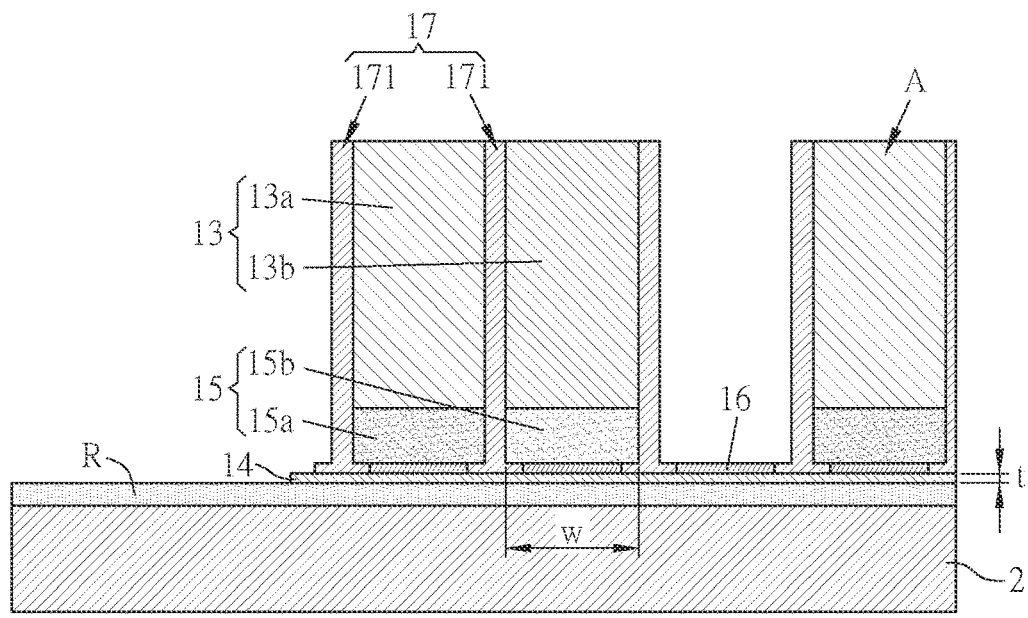

As shown in FIG. 1C, the third step is to provide a carrier 2, wherein a release layer R, a transparent layer 14, and a light conversion layer 13 are formed on the carrier 2 in order. Herein, the material of the carrier 2 can be, for example, glass, sapphire or any other material suitable for forming the release layer R thereon. The material of the release layer R is, for example, a polymer material that can be laser vaporized. In addition, the transparent layer 14 may be a light-permeable film, and the density of the transparent layer 14 can be less than or equal to 2.0 g/cm$^3$. The material of the transparent layer 14 may include, for example, acrylic (e.g. PMMA with a density of 1.18 g/cm$^3$), epoxy (with a density of 1.1~1.4 g/cm$^3$), or polyurethane (PU, with a density of 1~1.25 g/cm$^3$), but this disclosure is not limited thereto. For example, the transparent layer 14 may also be silicon oxide (SiO$_x$), titanium dioxide (TiO$_2$), aluminum oxide (Al$_2$O$_3$), silicon nitride (SiN$_x$), aluminum nitride (AlN), indium tin oxide (ITO), aluminum doped zinc oxide (AZO), any of other suitable light-permeable materials, or a combination thereof. The thickness of the transparent layer 14 can be less than or equal to 20 μm, such as 15 μm or 12 μm, preferably less than or equal to 10 μm, and more preferably less than or equal to 2 μm. In some embodiments, the thickness of the transparent layer 14 can be less than 1 μm, such as 0.5 μm. According to the different materials selected, the transparent layer 14 can be formed by spin coating, physical vapor deposition (PVD), chemical vapor deposition (CVD), atomic layer deposition (ALD), evaporation, sputtering, or the likes, or a combination thereof. In some embodiments, the transparent layer 14 is, for example but not limited to, an anti-reflection film, an anti-glare film, an anti-finger printing film, a waterproof and antifouling film, or an anti-scratch film, or a combination thereof, and this disclosure is not limited. In addition, the light conversion layer 13 can include a light conversion material, such as quantum dots (QD), phosphorescent material, or fluorescent material. In this embodiment, the light conversion material includes, for example, quantum dots, which form the light conversion portions 13a and 13b. In this case, the quantum dots of different sizes can be excited to generate light of different colors. For example, the quantum dots of different sizes are excited by blue light to generate red light and green light.

Figure 1D:
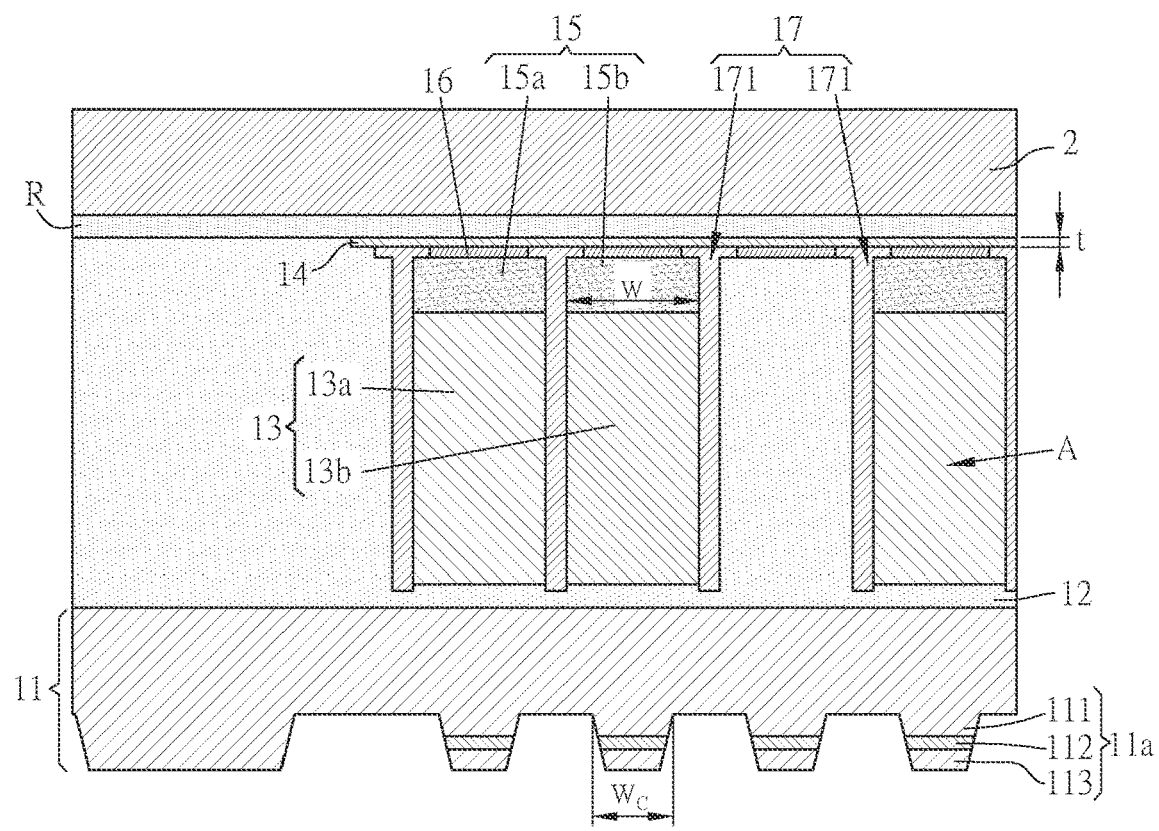

Referring to FIGS. 1C and 1D, in the step of forming a release layer R, a transparent layer 14 and a light conversion layer 13 on the carrier 2 in order, the manufacturing method of this embodiment further includes a step of patterning a light-shielding structure 17 on the carrier 2, wherein the light-shielding structure 17 includes a plurality of light-shielding portions 171, the light-shielding portions 171 define a plurality of light conversion regions A separated from each other, the light conversion regions A are located inside the light conversion layer 13, and each of each of which corresponds to one of the micro LEDs 11a. In other words, the light-shielding portions 171 are separately disposed inside the light conversion layer 13 so as to form a plurality of light conversion portions 13a, 13b in the light conversion regions A, and each of the light conversion regions A corresponds to one of the micro LEDs 11a.

Each of the light conversion portions 13a and 13b has a width w, and the transparent layer 14 has a thickness t. In this embodiment, the width w of the light conversion portion 13a or 13b is between 0.5 μm and 5 μm, such as 1 μm, 2 μm, 3 μm or 4 μm, but this disclosure is not limited thereto. The thickness t of the transparent layer 14 is between 0.5 μm and 20 μm, such as 1 μm, 3 μm, 5 μm, 7 μm, 10 μm, 12 μm or 15 μm, but this disclosure is not limited thereto. The thickness t of the transparent layer 14 and the width w of the light conversion portion 13a or 13b can be any suitable values selected from the above ranges, and the ratio of the thickness t of the transparent layer 14 to the width w of the light conversion portion 13a or 13b is between 0.1 and 40. To be noted, the "thickness t" indicates the thickness in the direction perpendicular to the surface of the carrier 2, and the "width w" indicates the width in the direction parallel to the surface of the carrier 2.

As shown in FIG. 1D, each micro LED 11a has a chip width $w_c$, and the chip width $w_c$ is less than or equal to the width w of the light conversion portion 13a or 13b. For example, in some embodiments, the chip width $w_c$ can be less than or equal to 3 μm.

In addition, the manufacturing method of this embodiment further includes a step of forming a light filter layer 15 between the light conversion layer 13 and the transparent layer 14, wherein the light filter layer 15 includes a plurality of light filter portions 15a and 15b, and the light filter portions 15a and 15b correspond to the light conversion portions 13a and 13b, respectively. Moreover, the light filter portions 15a and 15b are located in parts of the light conversion regions A, and each of the light filter portions 15a and 15b and the light conversion portions 13a and 13b corresponds in position to a part of the light conversion regions A. The regions that are not configured with any of the light filter layer 15 (the light filter portions 15a and 15b) and the light conversion layer 13 (the light conversion portions 13a and 13b) can be filled with any of other materials such as OCA, but this disclosure is not limited thereto. For example, the region that does not need the light conversion function can also be filled with a light filter material for increasing the purity of light color of the micro LEDs 11a. In this embodiment, the light filter portions 15a and 15b can include different light filter materials (filtering different color lights), such as the red light filter material or green light filter material.

Furthermore, in the step of forming a release layer R, a transparent layer 14 and a light conversion layer 13 on the carrier 2 in order, the manufacturing method of this embodiment further includes a step of forming a protection layer 16 between the light conversion layer 13 and the transparent layer 14. In this step, the protection layer 16 is formed between the transparent layer 14 and the light filter layer 15. The material of the protection layer 16 can be the same as or different from that of the transparent layer 14. The protection layer 16 can further block the external moisture and oxygen, thereby protecting the light filter layer 15 and the light conversion layer 13 from the damage of environmental moisture or oxygen. In the regions that are not configured with the light filter layer 15 and the light conversion layer 13, the material of the protection layer 16 can directly connect to the transparent layer 14. In different embodiments, the formed micro LED display device does not include the protection layer 16.

Afterwards, the fourth step is to attach the light conversion layer 13 to the connection layer 12, so that the carrier 2 configured with the release layer R, the transparent layer 14, and the light conversion layer 13 is fixed on the epitaxial structure layer 11 through the connection layer 12. In this embodiment, as shown in FIG. 1D, the carrier 2, which is formed with the release layer R, the transparent layer 14, the light-shielding structure 17, the protection layer 16, the light filter layer 15, and the light conversion layer 13, is fixed on (or attached to) the epitaxial structure layer 11 through the connection layer 12. To be noted, during the attaching and fixing procedure of the carrier 2 and the epitaxial structure layer 11, the material of the connection layer 12 may be pressed by the carrier 2 and flow toward the periphery of the light-shielding portions 171. Meanwhile, a part of the material of the connection layer 12 may flow into (fill) the space between two light-shielding portions 171, which are not configured with the light conversion layer 13 and the light filter layer 15. In this embodiment, the material of the connection layer 12 fulfills the space for firmly fixing the carrier 2 as well as the multiple layers formed thereon on the epitaxial structure layer 11. Moreover, during the attaching and fixing procedure of the carrier 2 and the epitaxial structure layer 11, since the transparent layer 14 is still covered by the release layer R, the material of the connection layer 12 does not overflow onto and cover the upper surface of the transparent layer 14.

Figure 1E:
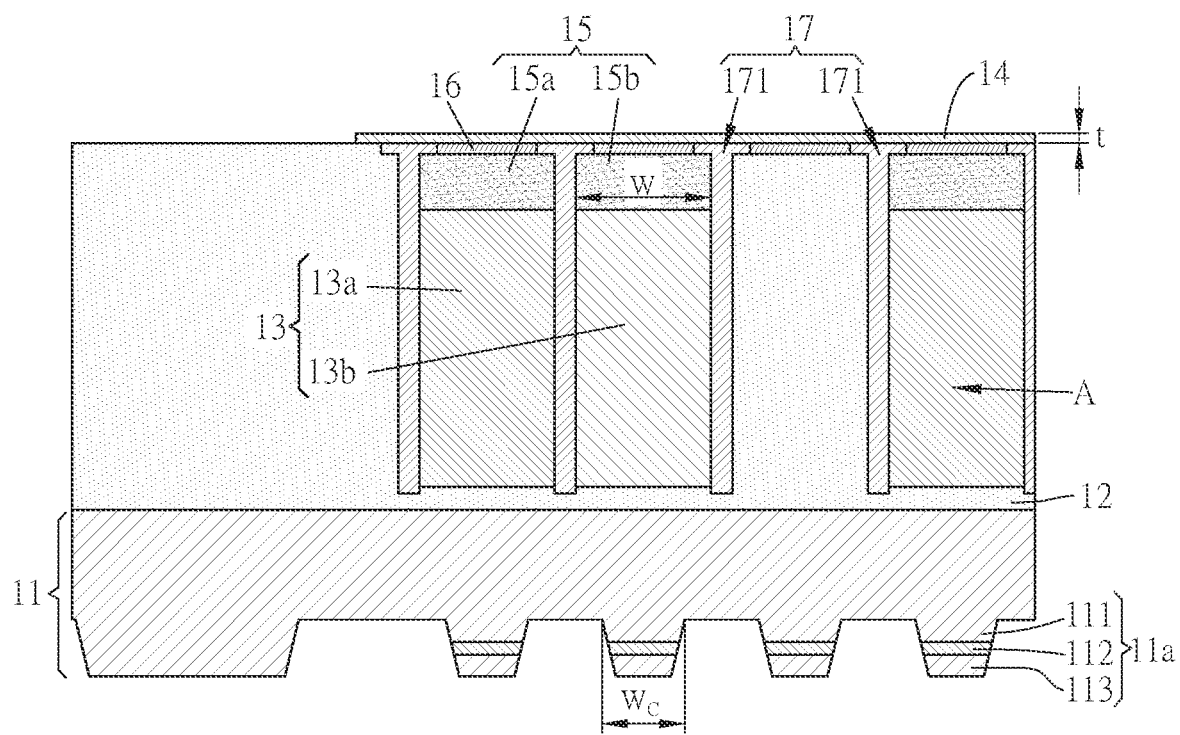

Finally, the fifth step is to remove the release layer R and the carrier 2 so as to obtain the structure as shown in FIG. 1E. In this embodiment, a part of the connection layer 12 (the material of the connection layer 12) is located between the light conversion layer 13 and the epitaxial structure layer 11, and the refractive index of the epitaxial structure layer 11 is less than the refractive index of the connection layer 12. In different embodiments, the material of the connection 12 can be completely squeezed out of the space between the light conversion layer 13 and the epitaxial structure layer 11 and flow to the periphery, so that there is no material of the connection layer 12 remaining between the light conversion layer 13 and the epitaxial structure layer 11.

The material of the above-mentioned light-shielding structure 17 (the light-shielding portions 171) can be a conductive or insulating opaque material (e.g., black material) for shielding or absorbing the light, thereby preventing the interference between different subpixels (e.g., the light mixing issue). In addition, the light filter portions 15a and 15b correspond to red light and green light, respectively, and so do the light conversion portions 13a and 13b. Accordingly, in each light conversion region A, the corresponding light conversion portion (e.g., the light conversion portion 13a) can convert the light emitted from the corresponding subpixel (i.e., the micro LED 11a) into the preset color, and then the light can pass through the corresponding light filter portion (e.g., the light filter portion 15a) and then exit the transparent layer 14.

In other embodiments, for example, if the thickness of the light conversion portions 13a and 13b is enough for generating the light achieving the required color purity, it is unnecessary to configure the light filter layer 15. In different embodiments, the micro LEDs 11a can cooperate with other suitable light conversion portions (and/or other suitable light filter portions) to generate other corresponding color lights (e.g., yellow light or white light), and this disclosure is not limited thereto.

As mentioned above, the connection layer 12 is formed at one side of the epitaxial structure layer 11 away from the micro LEDs 11a, the release layer R, the transparent layer 14 and the light conversion layer 13 are formed on the carrier 2 in order, the carrier 2 as well as the layers formed thereon is fixed above the epitaxial structure layer 11 through the connection layer 12, and then the release layer R and the carrier 2 are removed. Based on the above-mentioned design, the micro LED display device of this embodiment does not include the thick protection substrate (i.e., the carrier 2), thereby preventing the crosstalk or wave guiding problem so as to improve the display quality and decreasing the thickness and weight of the micro LED display device.

Figure 1F:
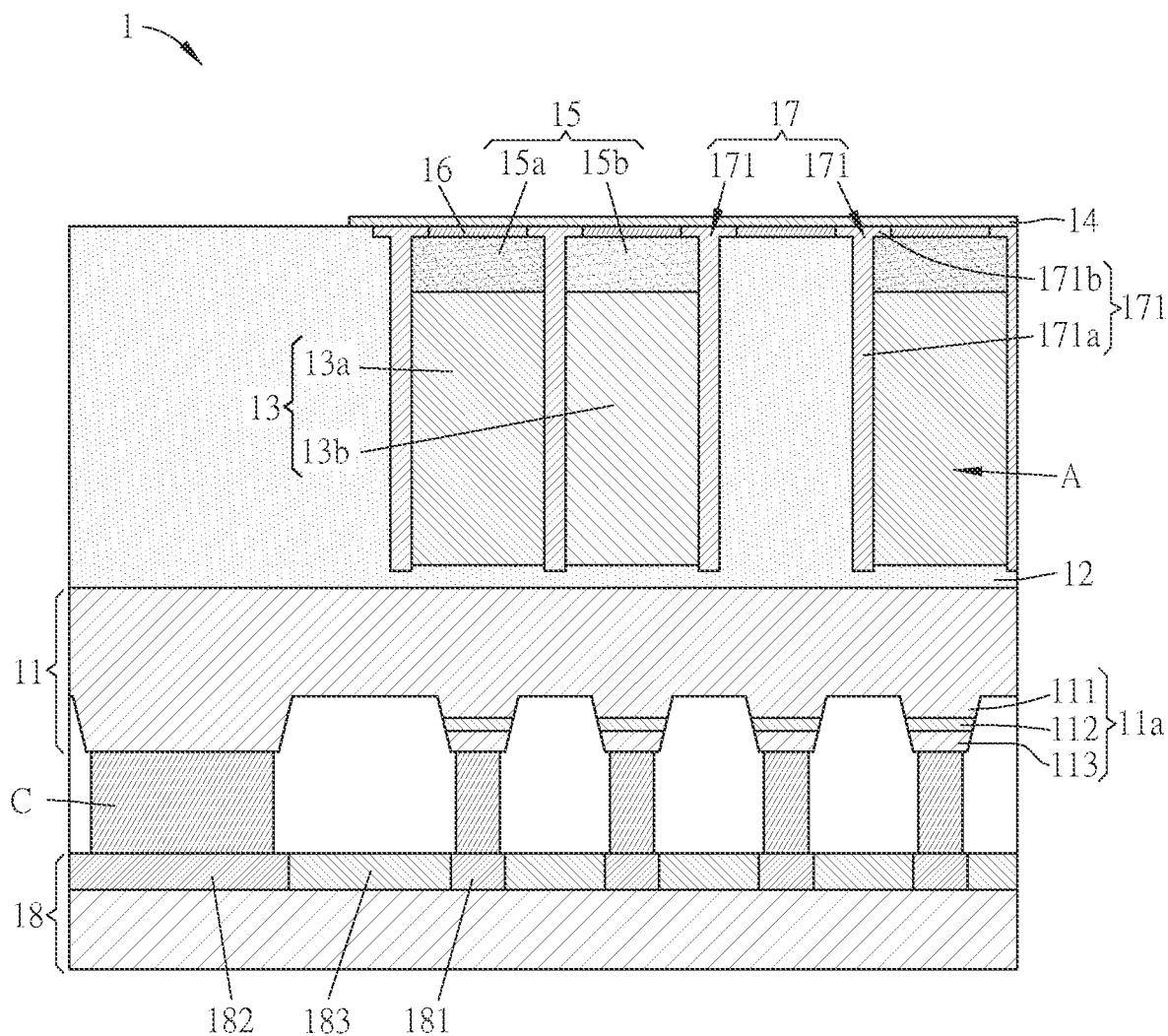

Referring to FIG. 1F, the micro LED display device 1 further includes a circuit substrate 18, which is electrically connected to the micro LEDs 11a for driving the micro LEDs 11a to emit light. The circuit substrate 18 includes a plurality of conductive electrodes, which are disposed corresponding to the micro LEDs 11a of the epitaxial structure layer 11 respectively (e.g., in one-to-one arrangement). In this embodiment, each conductive electrode is electrically connected to the corresponding circuit layer of the circuit substrate 18, and a dielectric layer 183 is configured between the conductive electrodes for isolating the conductive electrodes. Accordingly, the circuit substrate 18 can transmit the individually controlled electric signal to the corresponding conductive electrode through the circuit layer for driving the corresponding micro LED 11a to emit light. The circuit substrate 18 may be, for example, a Complementary Metal-Oxide-Semiconductor (CMOS) substrate, a Liquid Crystal on Silicon (LCOS) substrate, or a thin film transistor (TFT) substrate, or any of other circuit substrates with working circuits, but this disclosure is not limited thereto.

In this embodiment, the conductive electrodes may include a plurality of first electrodes 181 and a plurality of second electrodes 182. For example, FIG. 1F shows four first electrodes 181 and one second electrode 182. Each first electrode 181 is electrically connected to the corresponding micro LED 11a through one conductive member C. The second electrode 182 is functioned as another common electrode of the epitaxial structure layer 11, and they are electrically connected to each other through the conductive member C. The material of the conductive member C can be, for example but not limited to, tin, copper, silver, gold, or an alloy of any combination of the above-mentioned metals (e.g., copper plus a metal other than tin), and this disclosure is not limited.

As mentioned above, the micro LED display device 1 of this embodiment includes an epitaxial structure layer 11, a connection layer 12, a light conversion layer 13, and a transparent layer 14. The epitaxial structure layer 11 includes a plurality of micro LEDs 11a disposed apart from each other. The connection layer 12 is disposed at one side of the epitaxial structure layer 11 away from the micro LEDs 11a. A part of the material of the connection layer 12 is disposed between the light conversion layer 13 and the epitaxial structure layer 11, and the refractive index of the epitaxial structure layer 11 is less than that of the connection layer 12. The light conversion layer 13 is fixed on the epitaxial structure layer 11 through the connection layer 12, and the light conversion layer 13 includes the light conversion portions 13a and 13b. The transparent layer 14 is disposed at one side of the light conversion layer 13 away from the epitaxial structure layer 11. The density of the transparent layer 14 is less than or equal to 2.0 $g/cm^3$, and the material thereof includes, for example, acrylic (with a density of 1.18 $g/cm^3$), epoxy (with a density of 1.1~1.4 $g/cm^3$), or polyurethane (PU, with a density of 1~1.25 $g/cm^3$). In other embodiments, the transparent layer 14 may include silicon oxide ($SiO_x$), titanium dioxide ($TiO_2$), aluminum oxide ($Al_2O_3$), silicon nitride ($SiN_x$), aluminum nitride (AlN), indium tin oxide (ITO), aluminum doped zinc oxide (AZO), any of other suitable light-permeable materials, or a combination thereof. Moreover, the thickness of the transparent layer 14 can be less than or equal to 20 μm, such as 15 μm or 12 μm, preferably less than or equal to 10 μm, and more preferably less than or equal to 2 μm (such as 1 μm or 0.5 μm). As mentioned above, the ratio of the thickness t of the transparent layer 14 to the width w of the light conversion portion 13a or 13b is between 0.1 and 40. Accordingly, the relative thinner transparent layer 14 can prevent the interference between the outputted lights, thereby decreasing the crosstalk issue between the pixels.

In some embodiments, the micro LED display device 1 can be applied to a micro display device with high pixel density. For example, when the width w of the light conversion portions 13a and 13b (or the chip width $w_c$ of the corresponding micro LEDs 11a) is minimized to less than 3 μm, the pixel density of the micro LED display device 1 can be up to 3000 ppi or more.

In addition, the micro LED display device 1 of this embodiment further includes a light filter layer 15, which is disposed between the light conversion layer 13 and the transparent layer 14. The light filter layer 15 includes a plurality of light filter portions 15a and 15b, each the light filter portions 15a and 15b are disposed corresponding to the light conversion portions 13a and 13b, respectively.

Considering the case including only a single-layer thinned transparent layer 14, in order to effectively protect the light filter layer 15 and the light conversion layer 13, the micro LED display device 1 of this embodiment may further include a protection layer 16 disposed between the transparent layer 14 and the light conversion layer 13. In this case, the protection layer 16 can effectively block the external moisture and oxygen to protect the light filter layer 15 and the light conversion layer 13. The protection layer 16 is disposed adjacent to the transparent layer 14 and the light filter layer 15 (i.e., located between the transparent layer 14 and the light filter layer 15). In different embodiments, if the light conversion layer 13 is provided with a thickness sufficient to completely convert the light, the light filter layer 15 is not needed.

In addition, the micro LED display device 1 of this embodiment further includes a light-shielding structure 17, which is patterned on the epitaxial structure layer 11. The light-shielding structure 17 includes a plurality of light-shielding portions 171, which are separately disposed inside the light conversion layer 13 so as to form a plurality of light conversion portions 13a and 13b in the light conversion layer 13. The configurations and relations of the light conversion portions 13a and 13b, the light conversion regions A, and the micro LEDs 11a can be referred to the above embodiment, so the detailed descriptions thereof will be omitted.

In this embodiment, each light-shielding portion 171 has a T-shape, and it includes a first section 171a and a second section 171b. The second section 171b is located between the transparent layer 14 and the first section 171a. The projection area of the first section 171a projected on the epitaxial structure layer 11 is smaller than the projection area of the second section 171b projected on the epitaxial structure layer 11.

FIGS. 2A to 2G are schematic diagrams showing various micro LED display devices according to different embodiments of this disclosure.

Figure 2A:
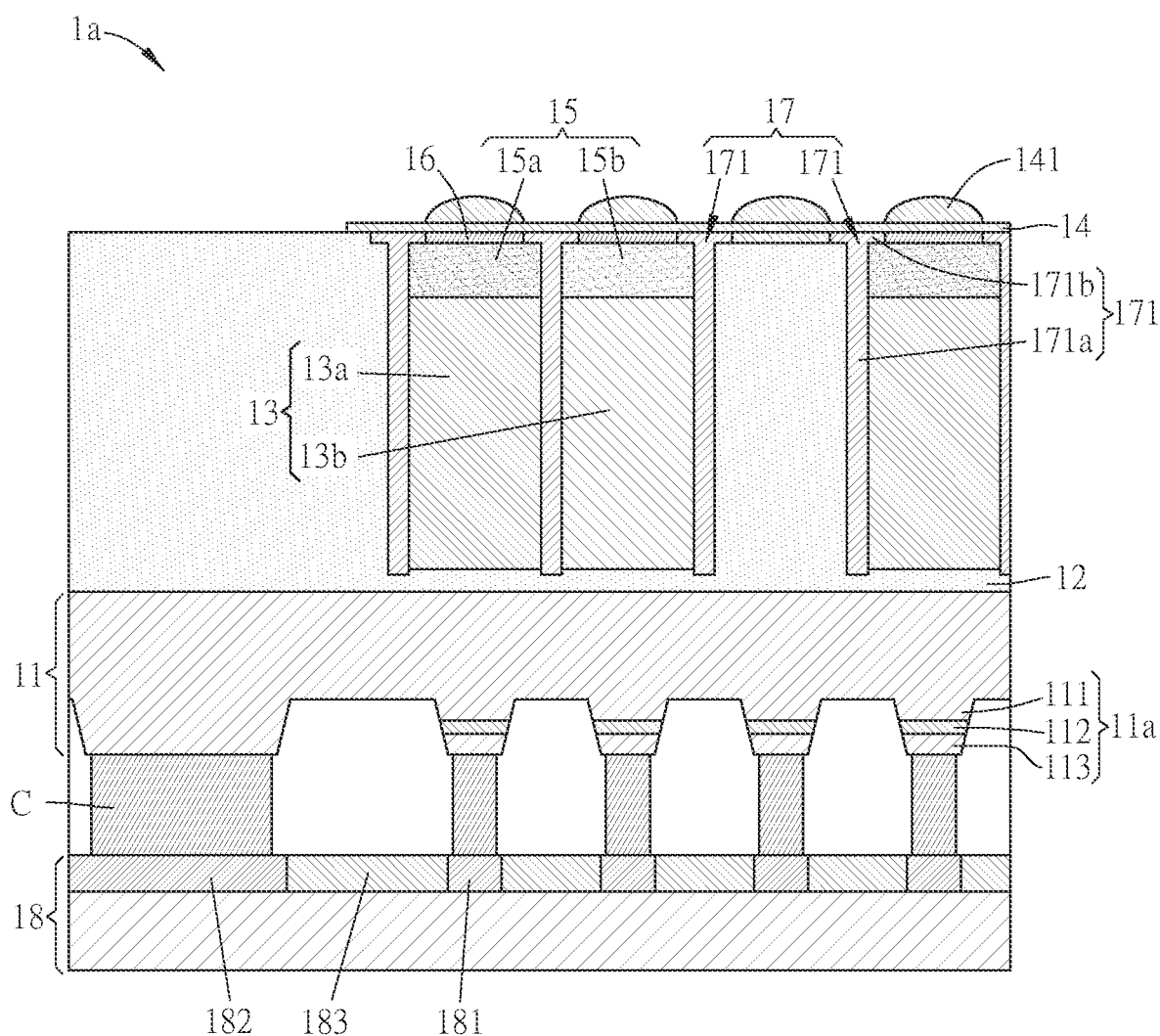
FIGS. 2A to 2G are schematic diagrams showing various micro LED display devices according to different embodiments of this disclosure.

As shown in FIG. 2A, the configurations and connections of the components in the LED micro display device 1a of this embodiment are mostly the same as those of the LED micro display device 1 of the previous embodiment. Different from the previous embodiment, in the LED micro display device 1a of this embodiment, at least one side of the transparent layer 14 is configured with a plurality of refractive structures 141 (e.g. light concentrating structures). The refractive structures 141 protrude toward or away from the light conversion layer 13, and each of the refractive structures 141 is disposed corresponding to one of the micro LEDs 11a. In this embodiment, the surface of the transparent layer 14 away from the micro LEDs 11a is configured with a plurality of refractive structures 141, and one refractive structure 141 is disposed corresponding to one micro LED 11a for example. In addition, the material of the refractive structures 141 is the same as that of the transparent layer 14, but this disclosure is not limited thereto. For example, the transparent layer 14 as well as the refractive structures 141 can be formed by one single step. In different embodiments, the material of the refractive structures 141 is different from that of the transparent layer 14. The configuration of the refractive structures 141 can concentrate the lights emitted from the corresponding micro LEDs 11a (subpixels), thereby generating the refractive effect and improving the crosstalk issue between the subpixels so as to enhance the display quality. In addition, in different embodiments, one refractive structure 141 can be disposed corresponding to three micro LEDs 11a (three micro LEDs 11a construct one pixel), and this disclosure is not limited.

Figure 2B:
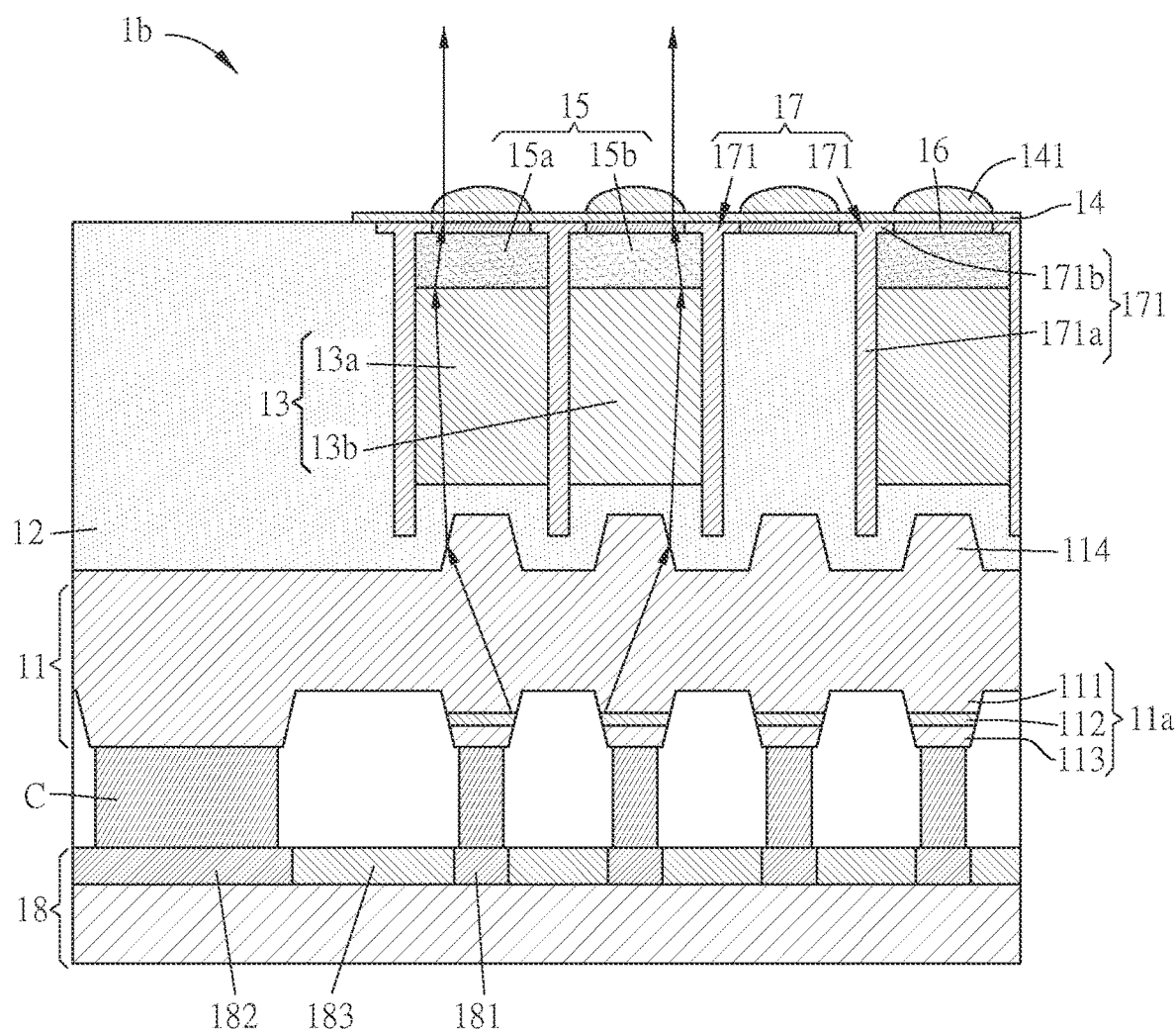

As shown in FIG. 2B, the configurations and connections of the components in the LED micro display device 1b of this embodiment are mostly the same as those of the LED micro display device 1a of the previous embodiment. Different from the previous embodiment, in the LED micro display device 1b of this embodiment, the epitaxial structure layer 11 further includes a plurality of protrusion portions 114 protruding toward the light conversion layer 13, and each of the protrusion portions 114 is disposed corresponding to one of the micro LEDs 11a. That is, one protrusion portion 114 is disposed corresponding to one micro LED 11a. The cross-sectional shape of the protrusion portion 114 is, for example, a trapezoid, but this disclosure is not limited thereto. In addition, the refractive index of the epitaxial structure layer 11 is greater than that of the connection layer 12, so that the light emitted from the micro LED 11a can pass through the connection layer 12, the light conversion layer 13, the light filter layer 15, the protection layer 16, the transparent layer 14 and the refractive structure 141, and then be outputted. Moreover, the micro LED display device 1b of this embodiment further includes the protrusion portions 114 and the refractive structures 141 for example. In different embodiments, the micro LED display device may include either the protrusion portions 114 or the refractive structures 141. For example, the micro LED display device may include the protrusion portions 114, but does not include the refractive structures 141; or the micro LED display device may include the refractive structures 141, but does not include the protrusion portions 114 (as shown in FIG. 2A). In another embodiment, the micro LED display device may include neither the protrusion portions 114 nor the refractive structures 141 (as shown in FIG. 2F or FIG. 2G).

Figure 2C:
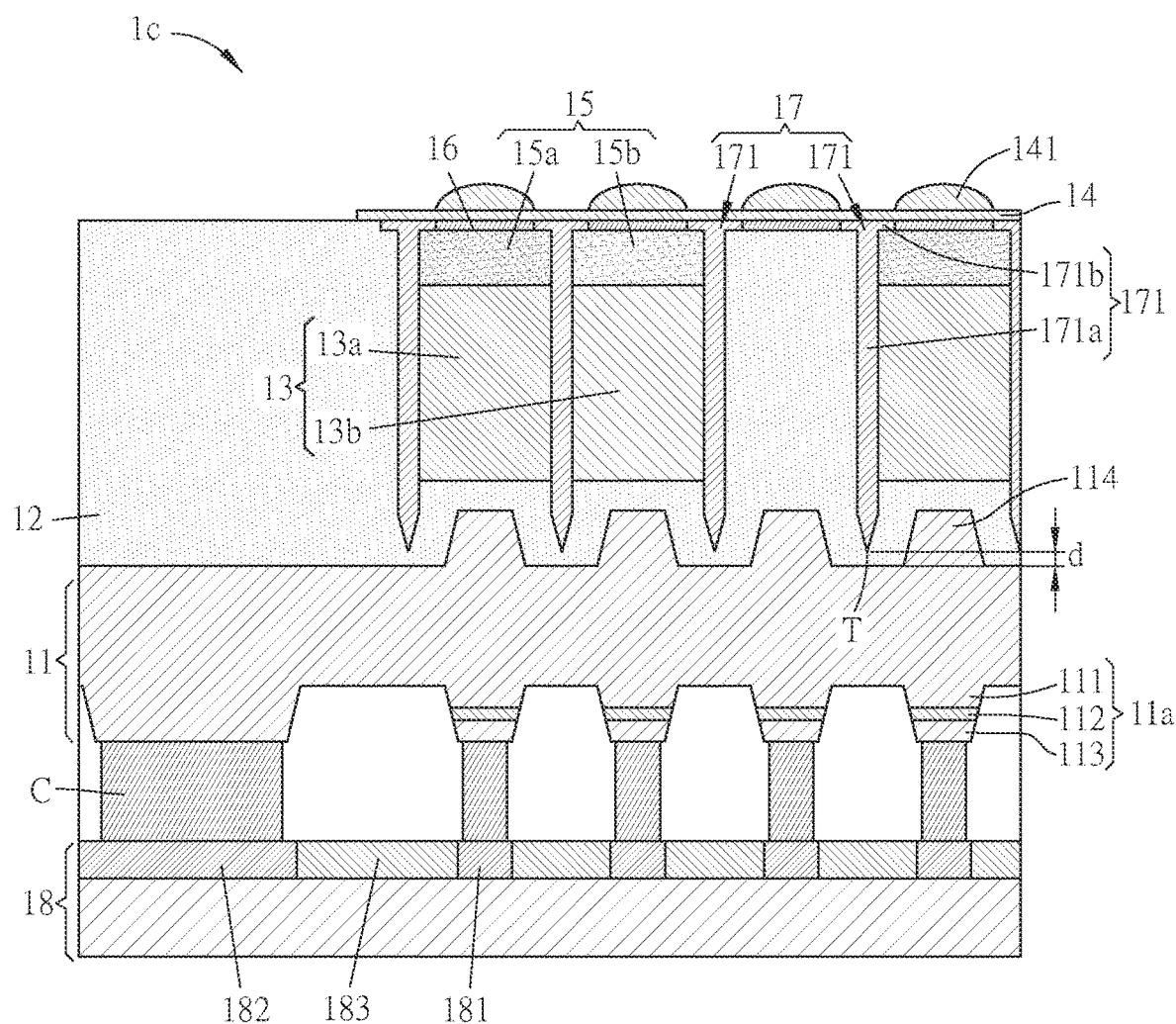

As shown in FIG. 2C, the configurations and connections of the components in the LED micro display device 1c of this embodiment are mostly the same as those of the LED micro display device of the previous embodiment. Different from the previous embodiment, in the LED micro display device 1c of this embodiment, the first section 171a of the light-shielding portion 171 has one end T away from the second section 171b. In this embodiment, the end T and the connection layer 12 define a first contact area, and the first section 171a and the second section 171b define a second contact area. The second contact area is greater than the first contact area. Herein, the end T is the tip part of the first section 171a, and the micro LED 11a is located between two adjacent ends T in the projection direction perpendicular to the epitaxial structure layer 11.

Figure 2D:
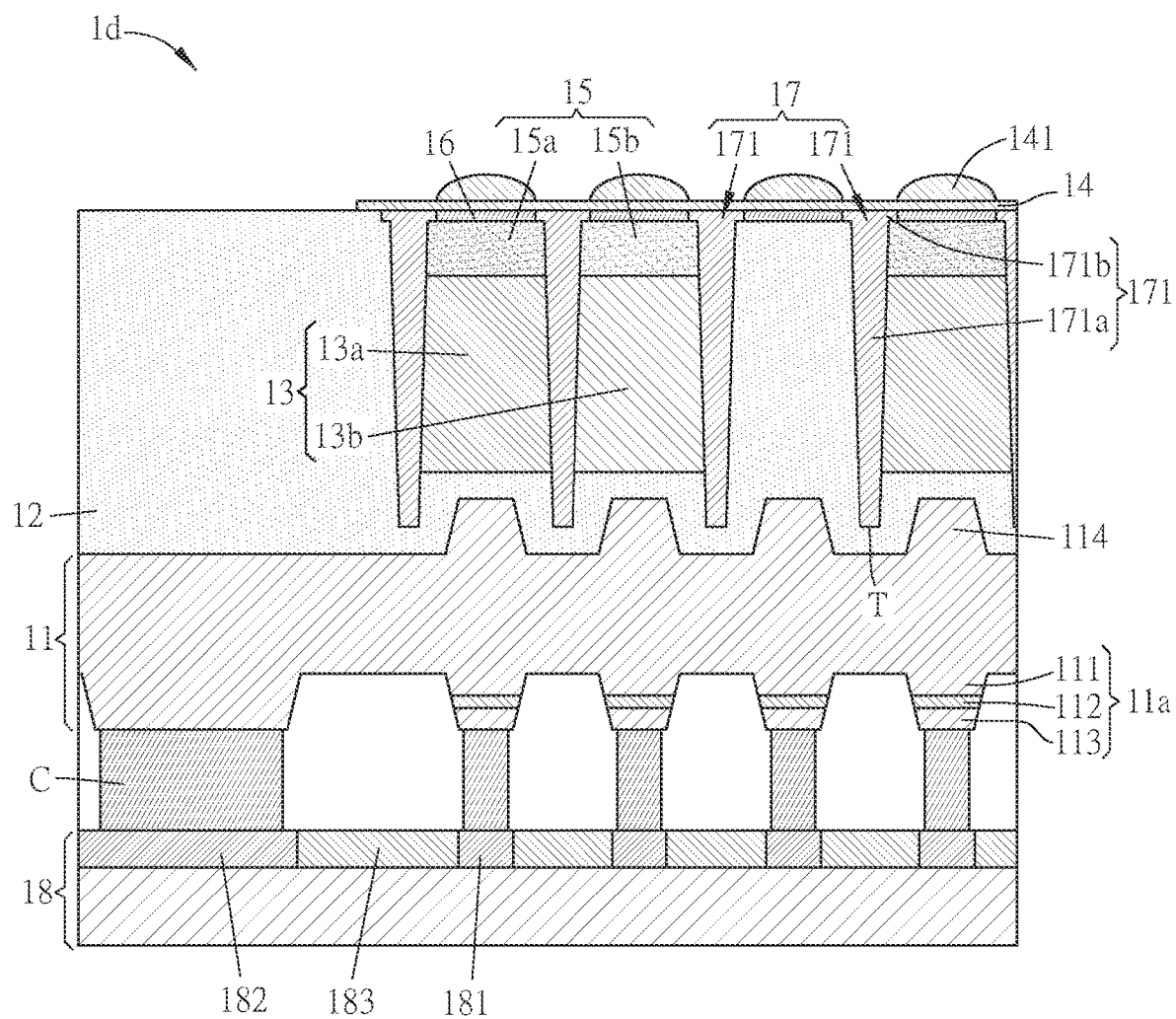

As shown in FIG. 2D, the configurations and connections of the components in the LED micro display device 1d of this embodiment are mostly the same as those of the LED micro display device of the previous embodiment. Different from the previous embodiment, in the LED micro display device 1d of this embodiment, the cross-sectional area of the first section 171a of the light-shielding portion 171 is tapered off in a direction from the second section 171b to the epitaxial structure layer 11. In other words, the cross-sectional area of the first section 171a is tapered off in a direction toward the epitaxial structure layer 11 on the plane parallel to the surface of the circuit substrate 18.

To be noted, in the embodiments of FIGS. 2C and 2D, the cross-sectional area of the first second 171a of the light-shielding portion 171 is varied (i.e., the cross-sectional area of the light-shielding portion 171 close to the epitaxial structure layer 11 is smaller than the cross-sectional area of the light-shielding portion 171 away from the epitaxial structure layer 11). Accordingly, when the epitaxial structure layer 11 is attached to the connection layer 12, the allowable offset space for the protrusion portions 114 (and the corresponding micro LEDs 11a) can be increased with respect to the surrounding light-shielding portion 171. Besides, the smaller contact surface can amplify the pressing stress of the end T on the connection layer 12. Thus, during the attaching process, it is easier to embed the light-shielding portion 171 (the first section 171a) in the connection layer 12. That is, as shown in FIG. 2C, the distance d between the end T and the epitaxial structure layer 11 becomes smaller. On the other hand, since the volume of the first section 171a of the light-shielding portion 171 becomes smaller due to the change in the cross-sectional area thereof, the extra space can accommodate more amount of the material of the connection layer 12. This configuration can reduce the amount of the material of the connection layer 12 overflowing to the space outside the light-shielding structure 17 when the connection layer 12 is pressed, thereby reducing the thickness of the connection layer 12 and preventing the optical crosstalk issue.

Figure 2E:
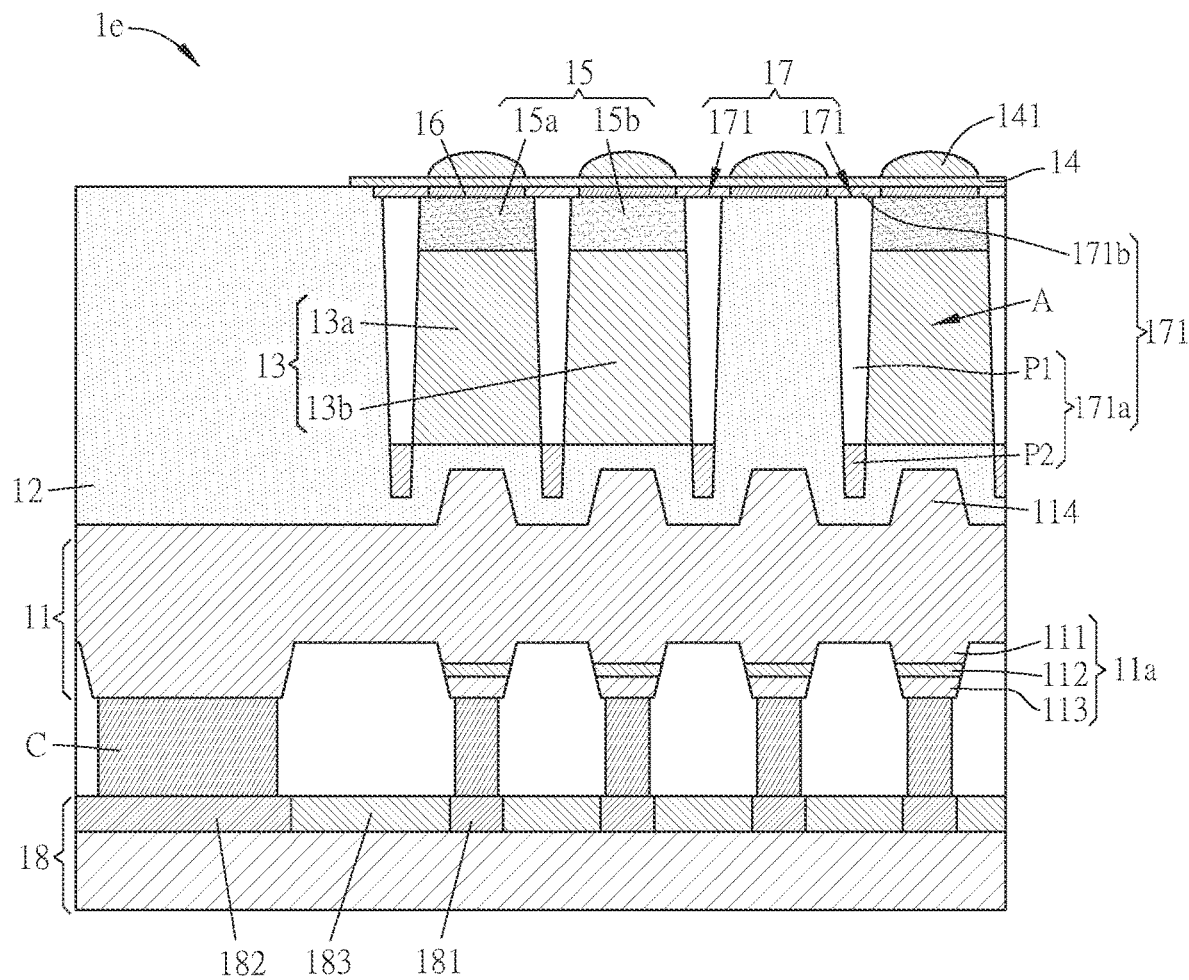
Figure 2F:
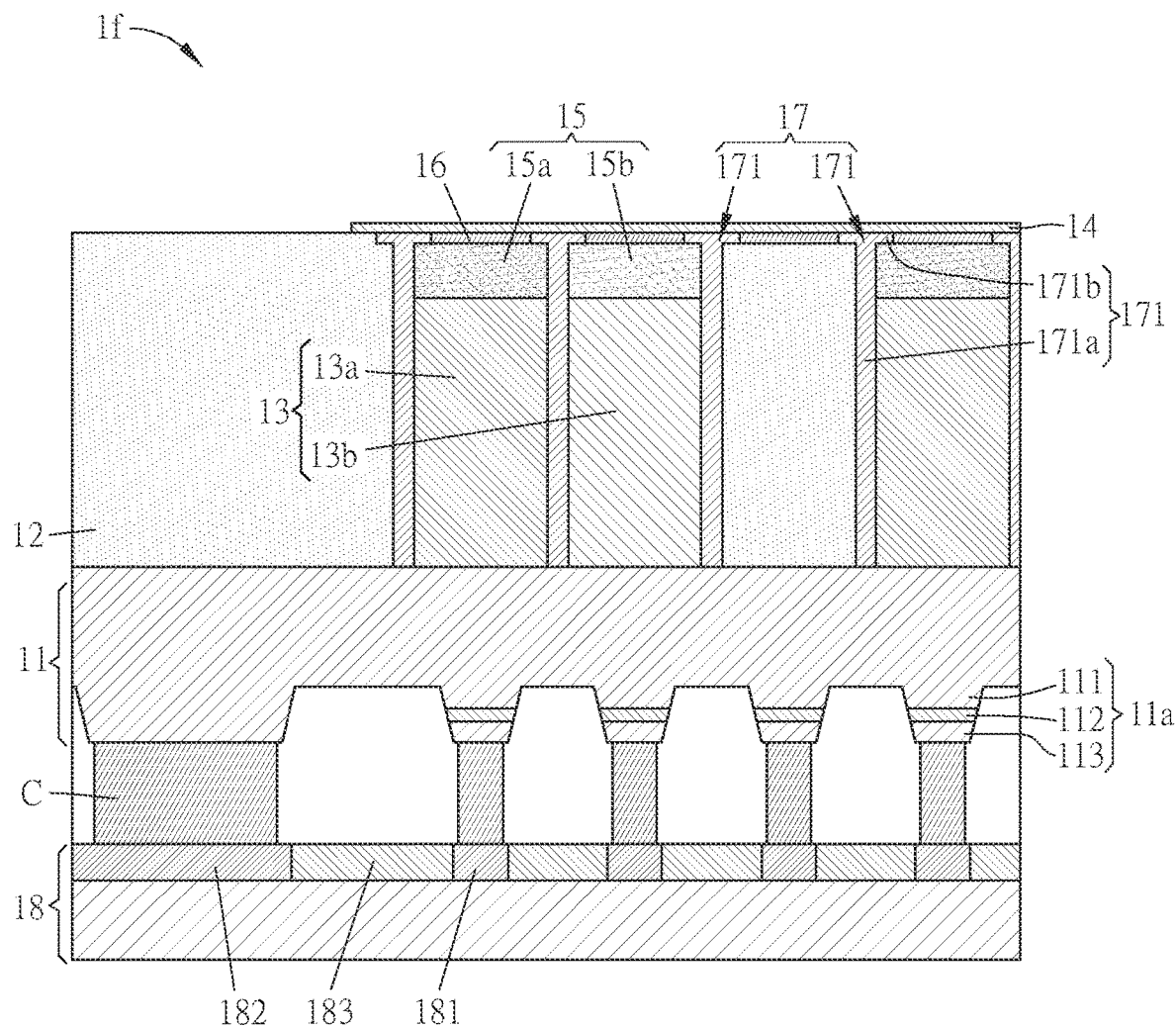
Figure 2G:
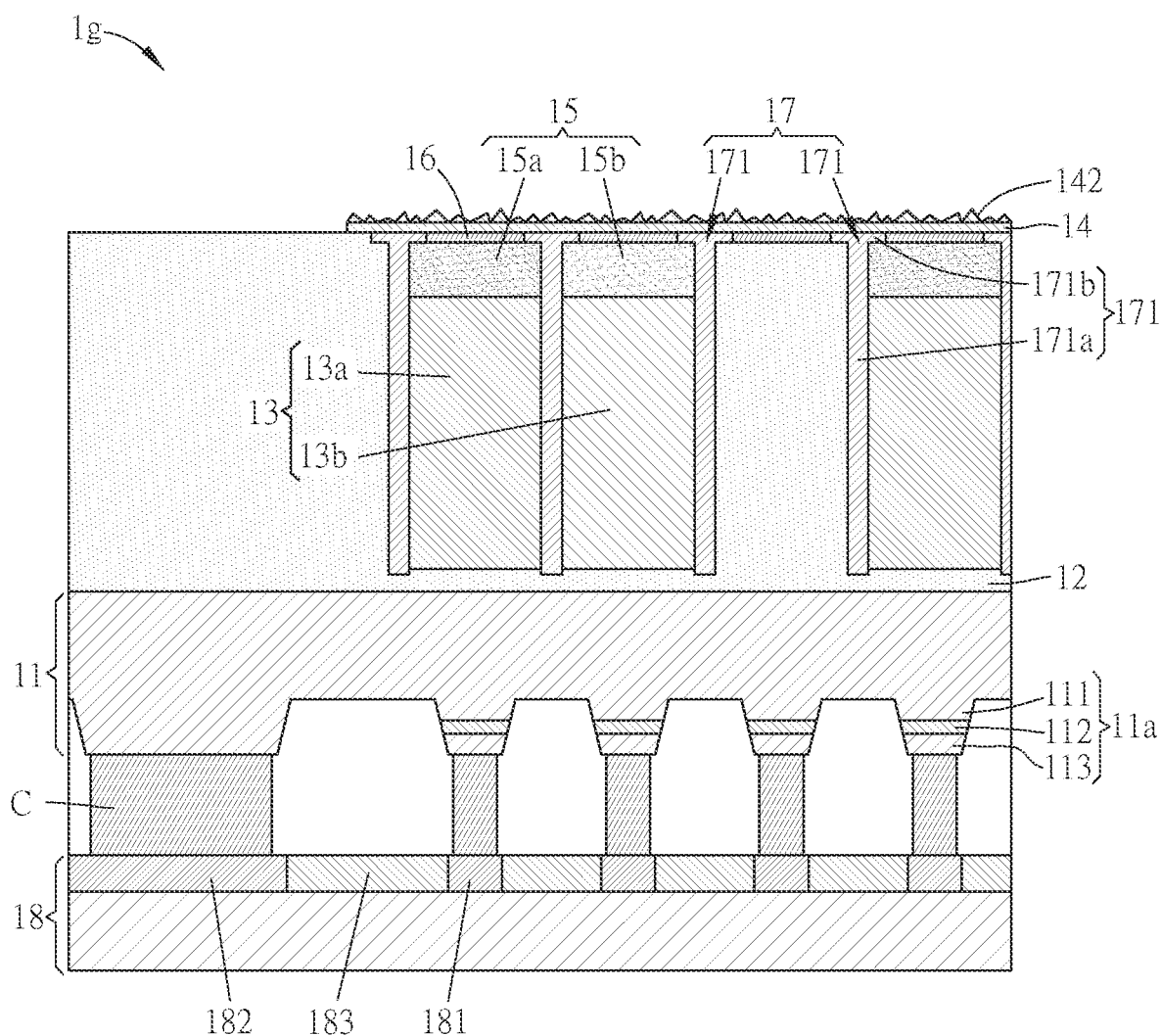

As shown in FIG. 2E, the configurations and connections of the components in the LED micro display device 1e of this embodiment are mostly the same as those of the LED micro display device of the previous embodiment. Different from the previous embodiment, in the LED micro display device 1e of this embodiment, the light-shielding portion 171 further includes a light reflection region P1. In this embodiment, a partial surface of the first section 171a is configured with a light reflection material, so that the light reflection region P1 is formed in the first section 171a and arranged around the light conversion region A and corresponding to the light conversion layer 13 and the light filter layer 15. In practice, a layer of light reflection material (e.g., aluminum or silver) is coated in the first section 171a corresponding the light conversion region A so as to form the light reflection region P1. The part (surface) of the light-shielding portion 171 other than the light reflection region P1 can be a light absorption region P2. The second section 171b is not configured with the light reflection material, so it is defined as a light absorption region. The light absorption region P2 of the first section 171a is located inside the connection layer 12, and the light reflection region P1 is located between the light absorption region P2 and the second section 171b. The light reflection region P1 can reflect light so as to increase the light output efficiency of the light passing through the light conversion layer 13. The light absorption region p2 (and the second section 171b) can absorb light so as to prevent the light mixing of adjacent micro LEDs 11a. In this embodiment, since the light reflection region P1 is arranged around the light conversion region A, the amount of reflected light of the subpixel can be increased. On the other hand, since the light absorption region P2 is arranged at the top and bottom of the light-shielding portion 171, the interference to the adjacent subpixel can be reduced. In addition, in some embodiments, the light reflection region can be formed in the second section 171b, or in both of the first section 171a and the second section 171b. This disclosure is not limited.

As shown in FIG. 2F, the configurations and connections of the components in the LED micro display device if of this embodiment are mostly the same as those of the LED micro display device of the previous embodiment. Different from the previous embodiment, during the process of attaching the light conversion layer 13 to the connection layer 12 (such as the fourth step of the above-mentioned manufacturing method), the material of the connection layer 12 between the epitaxial structure layer 11 and the light conversion layer 13 (and the light-shielding structure 17) is, preferably, totally pushed out, thereby forming the micro LED display device if as shown in FIG. 2F. In this embodiment, since the space between the epitaxial structure layer 11 and the light conversion layer 13 as well as the light-shielding structure 17 substantially does not contain the connection layer 12, the crosstalk issue can be sufficiently improved, thereby further improving the display quality.

As shown in FIG. 2G, the configurations and connections of the components in the LED micro display device 1g of this embodiment are mostly the same as those of the LED micro display device of the previous embodiment. Different from the previous embodiment, the LED micro display device 1g of this embodiment further includes a light refraction layer 142 disposed at one side of the transparent layer 14 away from the light conversion layer 13, and the surface of the light refraction layer 142 is a rough surface. In this embodiment, the light refraction layer 142 can be naturally formed by the remained part of the release layer R after the carrier 2 is removed. Therefore, the surface of the light refraction layer 142 will appear irregular shape due to the manufacturing process (such as laser vaporization). The surface of the light refraction layer 142 can change the incident angle of the light traveling from the light refraction layer 142 to the air, so as to reduce the occurrence of total internal reflection, thereby increasing the light outputting efficiency. In different embodiments, it is also possible to directly roughen a surface of the transparent layer 14 away from the light conversion layer 13 to form the rough surface for providing the desired light refraction function.

To be noted, in different embodiments of this disclosure, different refraction indexes can be optionally selected based on the shape of the epitaxial structure layer and different configurations of the epitaxial structure layer and the connection layer. For example, in the embodiments of FIGS. 2A, 2F and 2G, the refractive index of the epitaxial structure layer 11 is less than the refractive index of the connection layer 12. However, in the embodiments of FIGS. 2B to 2E (the epitaxial structure layer 11 includes the protrusion portions 114), the refractive index of the epitaxial structure layer 11 is greater than the refractive index of the connection layer 12.

As mentioned above, in the micro LED display device and manufacturing method thereof of this disclosure, the connection layer is formed at one side of the epitaxial structure layer away from the micro LEDs, the release layer, the transparent layer and the light conversion layer are formed on the carrier in order, the carrier as well as the release layer, the transparent layer and the light conversion layer is fixed on the epitaxial structure layer, and then the release layer and the carrier are removed. According to these manufacturing steps, the thick protection substrate (the carrier) used in the conventional micro LED display device can be removed. Accordingly, the crosstalk or wave guiding problem can be prevent so as to improve the display quality, and the thickness and weight of the micro LED display device can be decreased.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A micro light-emitting diode display device, comprising:
  an epitaxial structure layer comprising a plurality of micro light-emitting diodes disposed apart from each other;
  a connection layer disposed at one side of the epitaxial structure layer away from the micro light-emitting diodes;
  a light conversion layer fixed on the epitaxial structure layer through the connection layer and comprising a plurality of light conversion portions; wherein each of the light conversion portions corresponds to one of the micro light-emitting diodes and has a width;

a transparent layer disposed at one side of the light conversion layer away from the epitaxial structure layer and having a thickness; and a light-shielding structure patterned on the epitaxial structure layer, wherein the light-shielding structure comprises a plurality of light-shielding portions, the light-shielding portions define a plurality of light conversion regions separated from each other and located inside the light conversion layer, and each of the light conversion regions corresponds to one of the micro light-emitting diodes;

wherein a ratio of the thickness of the transparent layer to the width of each of the light conversion portions is between 0.1 and 40, wherein the epitaxial structure layer further comprises a plurality of protrusion portions protruding toward the light conversion layer and into the connection layer, each of the protrusion portions is disposed corresponding to one of the micro light-emitting diodes, the protrusion portions are separated by the light-shielding portions, wherein a refractive index of the epitaxial structure layer is greater than a refractive index of the connection layer, wherein the cross-sectional area of each of the protrusion portions is tapered off in a direction toward the light conversion layer;

the protrusion portions and the micro light-emitting diodes are located on opposite sides of the epitaxial structure layer, and the connection layer covers the protrusion portions.

2. The micro light-emitting diode display device of claim 1, wherein the thickness of the transparent layer is less than or equal to 20 μm.

3. The micro light-emitting diode display device of claim 1, wherein each of the micro light-emitting diodes has a chip width, and the chip width is less than or equal to 3 μm.

4. The micro light-emitting diode display device of claim 1, further comprising:

a light filter layer disposed between the light conversion layer and the transparent layer;

wherein the light filter layer comprises a plurality of light filter portions, and each of the light filter portions correspond to each of the light conversion portions, respectively.

5. The micro light-emitting diode display device of claim 1, further comprising:

a protection layer disposed between the light conversion layer and the transparent layer.

6. The micro light-emitting diode display device of claim 1, wherein each of the light-shielding portions comprises a first section and a second section, the second section is located between the transparent layer and the first section, and a projection area of the first section projected on the epitaxial structure layer is smaller than a projection area of the second section projected on the epitaxial structure layer.

7. The micro light-emitting diode display device of claim 6, wherein a cross-sectional area of the first section is tapered off in a direction from the second section to the epitaxial structure layer.

8. The micro light-emitting diode display device of claim 1, wherein each of the light-shielding portions comprises a first section and a second section, the second section is located between the transparent layer and the first section, the first section has one end away from the second section, the end and the connection layer define a first contact area, the first section and the second section define a second contact area, and the second contact area is greater than the first contact area.

9. The micro light-emitting diode display device of claim 6, wherein each of the light-shielding portions further comprises a light reflection region.

10. The micro light-emitting diode display device of claim 9, wherein each of the light reflection regions is located in the first section of each of the light-shielding portions, and the light reflection regions are disposed corresponding to the light conversion regions.

11. The micro light-emitting diode display device of claim 1, wherein a part of the connection layer is located between the light conversion layer and the epitaxial structure layer.

12. The micro light-emitting diode display device of claim 1, wherein at least one side of the transparent layer is configured with a plurality of refractive structures, the refractive structures protrude toward or away from the light conversion layer, and each of the refractive structures is disposed corresponding to one of the micro light-emitting diodes.

* * * * *